(12) United States Patent
Li et al.

(10) Patent No.: US 11,929,385 B2
(45) Date of Patent: Mar. 12, 2024

(54) METHOD FOR FORMING A PIXELATED OPTOELECTRONIC DEVICE ON A SUBSTRATE

(71) Applicant: IMEC VZW, Leuven (BE)

(72) Inventors: Yunlong Li, Heverlee (BE); Stefano Guerrieri, Kessel-lo (BE); Ming Mao, Leuven (BE); Luis Moreno Hagelsieb, Brussels (BE)

(73) Assignee: Imec vzw, Leuven (BE)

( * ) Notice: Subject to any disclaimer, the term of this patent is extended or adjusted under 35 U.S.C. 154(b) by 494 days.

(21) Appl. No.: 17/366,843

(22) Filed: Jul. 2, 2021

(65) Prior Publication Data
US 2022/0005862 A1 Jan. 6, 2022

(30) Foreign Application Priority Data
Jul. 3, 2020 (EP) ..................................... 20184095

(51) Int. Cl.
*H01L 27/146* (2006.01)

(52) U.S. Cl.
CPC .. *H01L 27/14689* (2013.01); *H01L 27/14621* (2013.01); *H01L 27/14627* (2013.01); *H01L 27/14643* (2013.01)

(58) Field of Classification Search
CPC ......... H01L 27/14621; H01L 27/14627; H01L 27/14643
USPC ...................................................... 438/29, 69
See application file for complete search history.

(56) References Cited

U.S. PATENT DOCUMENTS

| 6,133,615 | A | 10/2000 | Guckel et al. |
| 8,987,752 | B2 * | 3/2015 | Ho .................... H01L 33/0095 257/79 |
| 2003/0057357 | A1 | 3/2003 | Uppal et al. |
| 2004/0266053 | A1 | 12/2004 | Varghese |
| 2009/0166694 | A1 | 7/2009 | Kim |

(Continued)

FOREIGN PATENT DOCUMENTS

CN       108987425 A       12/2018

OTHER PUBLICATIONS

Extended European Search Report and Written Opinion, Application No. EP20184095.6, dated Dec. 7, 2020, 7 pages.

*Primary Examiner* — Hoai V Pham
(74) *Attorney, Agent, or Firm* — McDonnell Boehnen Hulbert & Berghoff LLP

(57) ABSTRACT

A method for forming a pixelated optoelectronic stack comprises forming a stacked layer structure that comprises a bottom electrode layer, an optoelectronic layer over the bottom electrode layer, and a patterned hard-mask comprising a pattern over the optoelectronic layer. The method comprises replicating the pattern into the optoelectronic layer and the bottom electrode layer, thereby forming a first intermediate pixelated stack comprising at least two islands of stack separated from one another by stack-free areas; providing an electrically insulating layer on the first intermediate pixelated stack; removing a top portion of the electrically insulating layer and removing any remaining hard-mask so that a top surface of the electrically insulating layer is coplanar with an exposed top surface of the first intermediate pixelated stack, yielding a second intermediate pixelated stack; and forming a top transparent electrode layer over the second intermediate pixelated stack.

20 Claims, 3 Drawing Sheets

(56) References Cited

U.S. PATENT DOCUMENTS

2009/0166778 A1   7/2009  Jun
2015/0129836 A1   5/2015  Augusto
2016/0163749 A1   6/2016  Yang et al.

\* cited by examiner

METHOD FOR FORMING A PIXELATED OPTOELECTRONIC DEVICE ON A SUBSTRATE

CROSS-REFERENCE TO RELATED APPLICATIONS

The present application is a non-provisional patent application claiming priority to European Patent Application No. 20184095.6, filed Jul. 3, 2020, the contents of which are hereby incorporated by reference.

FIELD OF THE DISCLOSURE

The present invention relates to optoelectronic devices. In particular, the present invention relates to a method for producing a pixelated optoelectronic device, and to a pixelated optoelectronic device producible by that method.

BACKGROUND

Optoelectronic devices having thin film optoelectronic (TFO) layers (i.e., a TFO device), commonly use a stack of layers comprising a bottom electrode, an optoelectronic stack on top of the bottom electrode, and a top transparent electrode on top of the optoelectronic stack. The optoelectronic stack typically consists of three basic functional layers, i.e., an electron transport layer (ETL), an active layer, and a hole transport layer (HTL). An example of a TFO device is a sensing device comprising a photodiode (PD) layer, e.g., a thin-film photodiode (TFPD) device. In this case, photons are injected through the top transparent electrode into the active (here photo-active) layer, thereby generating pairs of electrons and holes in the photo-active layer, which are extracted to the electrodes as an output signal. Another example of a TFO device is a light-emitting diode (LED). In that case, electrons and holes are injected via the electrodes into the ETL and HTL, respectively, to subsequently move into the light-emitting layer, where the electrons and holes form photons that can pass through the top transparent electrode. Although the following discussion focuses on PD devices, similar issues arise for LEDs.

PD devices can comprise a plurality of pixels forming a pixel array. In general, for a PD device comprising a pixel array, the top transparent electrode is used as a common connection for all pixels in the array. The bottom electrode, on the other hand, is pixelated. Each bottom electrode pixel can generate an output signal, where the output signal is in principle related to the intensity of the light incident on the photo-active layer above the electrode pixel. By combining the output signals of all bottom electrode pixels, an output image can be generated, where the electrical signal from each pixelated bottom electrode corresponds to one pixel of the output image.

At present, the common practice for fabricating PD devices is that, first, the bottom electrode is fabricated by patterning. After that, the optoelectronic stack is formed on top of the pixelated bottom electrodes by spin-coating, evaporation, sputtering, or other deposition techniques. Often, the bottom electrodes are electrically isolated from each other while the optoelectronic stack is continuous. For such a configuration, one of the noise sources in the pixel array is the crosstalk between neighboring pixels. For example, the photon carriers generated in one pixel may diffuse horizontally through the functional layers (e.g., ETL, HTL, or photo-active layer) into the neighboring pixels and trigger unexpected read-out signal (noise). With the pixel size scaling down, the distance/gap between neighboring bottom electrodes is approaching the diffusion length of the photo carriers generated in the photo-active layer, and the crosstalk noise will dramatically increase with the pixel size scaling.

To prevent this crosstalk noise, one practice is to pixelate the optoelectronic stack into pixels as well, so that the inter-pixel crosstalk can be significantly reduced. In the state-of-the-art, the bottom electrode is first pixelated by selective etching such that islands of bottom electrode are formed, and, e.g., dielectric material is deposited selectively in the electrode-free space between the islands. Afterward, the optoelectronic stack is deposited on top of the pixelated bottom electrode. In turn, the optoelectronic stack can then be pixelated, e.g., via etching. For instance, for the fabrication of an LED array, in CN108987425, first, a plurality of electrode structures, i.e., equivalent to the pixelated bottom electrode, is created via a process comprising etching. On top, a continuous, LED functional structure is generated, which is subsequently etched to form a plurality of LED functional structures and a first opening penetrating the LED functional layer and located between two adjacent LED functional structures. Next, an isolation structure is formed in the first opening. Finally, on top of that, a continuous electrode is deposited connecting all pixels.

The step of etching the bottom electrode, which is performed before depositing the optoelectronic stack on top of the (pixelated) bottom electrode, however, introduces defects on the top surface of the bottom electrode, which can be detrimental for the electrical contact between the bottom electrode and the optoelectronic stack. Moreover, the top surface of the bottom electrode is roughened by the etching, reducing its reflectivity. High reflectivity of the top surface of the bottom electrode is, however, desirable so that, e.g., in a PD device used as a sensor, light that in a first pass passes unabsorbed through the optoelectronic stack, is reflected back by the bottom electrode into the optoelectronic stack, so that they are potentially absorbed in a second pass. Similarly, in an LED array, light emitted toward the bottom electrode is reflected back by the bottom electrode and emitted out of the top transparent electrode.

Furthermore, adhesion between, in particular, an organic/organic-inorganic optoelectronic stack and the dielectric material deposited between the islands of electrode is not good, which may result in delamination. Finally, there is also a need in the art for good methods for scaling up the pixelation process of organic/organic-inorganic film optoelectronic devices in CMOS fabrication, where little experience exists for such organic materials. In particular, such materials are prone to degradation during pixelation processes, e.g., by absorbing moisture or by oxidation when exposed to the ambient environment, e.g., immediately after the pixelation process.

SUMMARY

Aspects of this disclosure are directed to pixelated optoelectronic devices and methods for forming pixelated optoelectronic devices.

Example embodiments of the pixelation process disclosed herein can be easily scaled up, and the method is compatible with CMOS fabrication. The process flow is short and has a very limited amount of steps, and in particular, pixelation steps. In this way, the total thermal treatment time of the thin film stack is minimized during the process flow.

Example embodiments facilitate the prevention of crosstalk between different pixels by pixelating the optoelectronic stack. Crosstalk between different pixels is minimized by preventing direct electronic contact between adjacent pixels of the optoelectronic stack. In an example, the pixels are isolated from ambient air, hence preventing the absorption of moisture and oxidation of the optoelectronic stack. In an example, device degradation is neither expected to occur during the patterning process nor during ambient storage after the pixelation process.

In example embodiments, because an optoelectronic stack is formed on the bottom electrode first, and only afterward, the optoelectronic stack and the bottom electrode are pixelated via etching in a single step, the defectivity of the top surface of the bottom electrode is not affected by the process. This sequence of steps leads to good adhesion between the bottom electrode and the optoelectronic stack. Further, the smoothness of the top surface of the bottom electrode is not affected, and hence its reflectivity is not affected either, resulting in improved external quantum efficiency (EQE) of an optoelectronic device comprising the optoelectronic stack formed according to embodiments of the method of this invention. If the optoelectronic device is a photodiode array, this translates into a better sensitivity.

In example embodiments, the optoelectronic stack is deposited on nothing but the bottom electrode: the adhesion between the optoelectronic stack and the bottom electrode is, in general, strong and, e.g., not prone to delamination.

In example embodiments, the optoelectronic array has a flat top surface, which facilitates the formation of post-process modules such as color filters or micro-lenses formed on top of the individual pixels.

A first aspect relates to a method for forming a pixelated optoelectronic stack on top of a substrate. The method comprises obtaining a stacked layer structure on a substrate. The stacked layer structure comprises a bottom electrode layer, an optoelectronic layer over the bottom electrode layer, and a patterned hard-mask over the optoelectronic layer and comprising a pattern comprising at least two hard-mask islands separated by a hard-mask-free area. The method further comprises replicating the pattern into the optoelectronic layer and the bottom electrode layer, by etching through the optoelectronic layer and the bottom electrode layer selectively with respect to the hard-mask, thereby obtaining a first intermediate pixelated stack on top of the substrate, the first intermediate pixelated stack comprising at least two islands of stack separated from one another by stack-free areas; providing an electrically insulating layer on the first intermediate pixelated stack so as to fill the stack-free areas and cover the at least two islands of stack; removing a top portion of the electrically insulating layer and removing any remaining hard-mask so that a top surface of the electrically insulating layer is coplanar with an exposed top surface of the first intermediate pixelated stack, yielding a second intermediate pixelated stack on top of the substrate; and forming a top transparent electrode layer over the second intermediate pixelated stack.

A second aspect relates to an intermediate structure in the formation of a pixelated optoelectronic device. The device comprises a stacked layer structure on a substrate. The stacked layer structure comprises a continuous bottom electrode layer, an optoelectronic layer over the bottom electrode layer, and a patterned hard-mask over the optoelectronic layer and comprising a pattern comprising at least two hard-mask islands separated by a hard-mask-free area. The vertical projection of each hard-mask island on a top surface of the continuous bottom electrode layer is comprised therein.

Particular aspects are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE FIGURES

The above, as well as additional features, will be better understood through the following illustrative and non-limiting detailed description of example embodiments, with reference to the appended drawings.

FIG. 1 illustrates a substrate comprising an integrated circuit layer and a connection layer on top of the integrated circuit layer, in accordance with an example embodiment.

FIG. 2 illustrates depositing of a stacked layer on the substrate, in accordance with an example embodiment.

FIG. 3 illustrates patterning of a hard-mask layer, in accordance with an example embodiment.

FIG. 4 illustrates replication of the pattern of the hard-mask layer into layers on top of the substrate, in accordance with an example embodiment.

FIG. 5 illustrates forming an electrically insulating layer over a first conformal electrically insulating layer, in accordance with an example embodiment.

FIG. 6 illustrates removal of the top portion of the electrically insulating layer and any remaining hard-mask, in accordance with an example embodiment.

FIG. 7 illustrates forming of a top transparent electrode layer over a second intermediate pixelated stack, in accordance with an example embodiment.

FIG. 8 illustrates removal of part of the top transparent electrode layer, in accordance with an example embodiment.

FIG. 9 illustrates depositing of a transparent capping layer is over the top transparent electrode layer, in accordance with an example embodiment.

Figure 1:
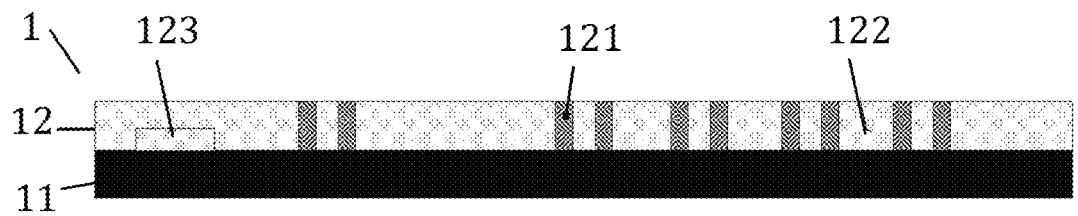
FIG. 1 to FIG. 9 show schematic representations of vertical cross-sections through intermediate structures obtained after different steps of a method according to an example embodiment.

In the different figures, the same reference signs refer to the same or analogous elements. Further the figures are schematic, not necessarily to scale, and generally only show parts that are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The terms first, second, third, and the like in the description and in the claims are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

The term "comprising," used in the claims, should not be interpreted as being restricted to the means listed thereafter. That is, the term does not exclude other elements or steps. It is thus to be interpreted as specifying the presence of the stated features, integers, steps or components as referred to, but does not preclude the presence or addition of one or more other features, integers, steps or components, or groups thereof. The term "comprising," therefore, covers the situation where only the stated features are present and the situation where these features and one or more other features are present. The word "comprising" according to the invention, therefore also includes as one embodiment that no further components are present. Thus, the scope of the expression "a device comprising means A and B" should not be interpreted as being limited to devices consisting only of components A and B.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures, or characteristics may be combined in any suitable manner, as would be apparent to one of ordinary skill in the art from this disclosure, in one or more embodiments.

Similarly, it should be appreciated that in the description of embodiments, various features of the invention are sometimes grouped together in a single embodiment, figure, or description thereof for the purpose of streamlining the disclosure and aiding in the understanding of one or more of the various aspects. This method of disclosure, however, is not to be interpreted as reflecting an intention that the claimed invention requires more features than are expressly recited in each claim. Rather, as the following claims reflect, aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some, but not other features included in other embodiments, combinations of features of different embodiments are meant to be within the scope of the claims and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

In the description provided herein, reference is made to selective etching. Selective etching of a first area with respect to a second area in embodiments indicates in an example that etching is performed at a higher etching rate for material comprised in the first area than for material comprised in the second area, e.g., twice as fast, ten times as fast, hundred times as fast, etc. In some example embodiments, selective etching indicates that material comprised in the second area is not, or at least not substantially, etched and that the material comprised in the first area is the only material that is substantially is etched.

A first aspect relates to a method for forming a pixelated optoelectronic stack on top of a substrate. The method comprises obtaining a stacked layer structure on a substrate. The stacked layer structure comprises a bottom electrode layer, an optoelectronic layer over the bottom electrode layer, and a patterned hard-mask over the optoelectronic layer and comprising a pattern comprising at least two hard-mask islands separated by a hard-mask-free area. The method further comprises replicating the pattern into the optoelectronic layer and the bottom electrode layer, by etching through the optoelectronic layer and the bottom electrode layer selectively with respect to the hard-mask, thereby obtaining a first intermediate pixelated stack on top of the substrate, the first intermediate pixelated stack comprising at least two islands of stack separated from one another by stack-free areas; providing an electrically insulating layer on the first intermediate pixelated stack so as to fill the stack-free areas and cover the at least two islands of stack; removing a top portion of the electrically insulating layer and removing any remaining hard-mask so that a top surface of the electrically insulating layer is coplanar with an exposed top surface of the first intermediate pixelated stack, yielding a second intermediate pixelated stack on top of the substrate; and forming a top transparent electrode layer over the second intermediate pixelated stack.

In embodiments, the bottom electrode layer has not been etched prior to step calling for replicating the pattern into the optoelectronic layer and the bottom electrode layer. In other words, it has not been etched after it has been formed. Yet, in other words, the bottom electrode layer may be a continuous, unpatterned layer. In this case, the defectivity of the top surface of the bottom electrode layer corresponds to the defectivity of the bottom electrode layer as formed. For instance, the top surface may be defect-free or relatively defect-poor. This level of defectivity facilitates physical and electrical contact between the bottom electrode layer and any layer deposited on the top surface of the bottom electrode layer. Further, the smoothness of the top surface corresponds to the smoothness of the bottom electrode layer as formed. This level of smoothness facilitates the reflection of light. In embodiments, the surface roughness has a root-mean-squared value equal to or less than 3 Å, such as from 2 to 3 Å. In embodiments, the contact area between the bottom electrode layer and the optoelectronic layer may be defect-free. In embodiments, the bottom electrode layer may be made of a conductive material that facilitates reflecting at least 80%, such as at least 90% of a light at the wavelength of maximum light absorption of an optoelectronic active layer comprised in the optoelectronic layer. The wavelength may, for instance, be in the visible, near-infrared, or mid-infrared wavelength range. Examples of typically suitable materials for the bottom electrode are metals, such as aluminum, copper, tantalum nitride and titanium nitride, in particular copper and titanium nitride. These materials are highly reflective over a broad range of wavelengths. The bottom electrode may be deposited, for instance, via chemical vapor deposition, physical vapor deposition, sputtering, pulsed laser deposition, atomic layer deposition, evaporation. In an example, the thickness of the bottom electrode is in the range of 50 nm-300 nm.

The optoelectronic layer is over the bottom electrode layer. In embodiments, it is on the optoelectronic layer. The optoelectronic layer comprises an optoelectronic active layer. For instance, if the method aims at forming an intermediate to a photodiode pixel array, the optoelectronic active layer may be a photo-active layer, and if the method aims at forming an intermediate to a light-emitting diode pixel array, the optoelectronic active layer may be a light-emitting layer.

In embodiments, the optoelectronic layer is a light-emitting diode stack, so that the device formed by embodiments according to the first aspect can be used in light-emitting devices.

The optoelectronic layer can be the optoelectronic active layer, but it is more typically a multilayer comprising the optoelectronic active layer.

In embodiments, the optoelectronic layer may comprise a first charge transport layer for transporting charges of a first polarity, over (e.g., on top of) the bottom electrode, an active optoelectronic layer over (e.g., on top of) the first charge transport layer, and a second charge transport layer for transporting charges of a second polarity, over (e.g., on top of) the optoelectronic layer. In embodiments, the charge of the first polarity can be a negative charge, i.e., carried by an electron, and the charge of the second polarity can be a positive charge, i.e., carried by a hole. In these embodiments, the first charge transport layer may comprise titanium oxide, and the second charge transport layer may comprise nickel oxide. In embodiments, the charge of the first polarity can be a positive charge, i.e., carried by a hole, and the charge of the second polarity can be a negative charge, i.e., carried by an electron. In these embodiments, the first charge transport layer may comprise nickel oxide, and the second charge transport layer may comprise titanium oxide. In embodiments, the active optoelectronic layer comprises or consists of organic materials or comprises quantum dots.

In example embodiments, the optoelectronic layer is a photodiode stack, so that the device formed by embodiments according to the first aspect can be used in sensor devices. In example embodiments where the optoelectronic layer is a photodiode stack, the layer selected from the first and second charge transport layer that transports electrons may comprise titanium oxide. In example embodiments where the optoelectronic layer is a photodiode stack, the layer selected from the first and second charge transport layer that transports holes comprises nickel oxide. In embodiments where the optoelectronic layer is a photodiode stack, the active optoelectronic layer may comprise quantum dots such as PbS quantum dots, CdS quantum dots, InGaAs quantum dots, or an organic photodiode material.

The patterned hard-mask can be obtained by first depositing a hard-mask layer of the optoelectronic layer and then patterning the hard-mask layer. The hard-mask layer can be patterned by, e.g., lithography, such as deep-UV lithography at a laser wavelength of 248 nm, and dry etch methods, such as reactive ion etching. The patterned hard-mask may comprise, or consist of, one of the following materials: silicon oxide, silicon nitride, titanium nitride, tantalum nitride, ruthenium and aluminum oxide.

In step calling for replicating the pattern into the optoelectronic layer and the bottom electrode layer, the optoelectronic layer and the bottom electrode layer are patterned, that is pixelated, in a single step, i.e., by etching, comprising, for instance, ion beam milling or applying a reactive ion etch, through the optoelectronic layer and the bottom electrode layer selectively with respect to the hard-mask, yielding the first intermediate pixelated stack on top of the substrate. In example embodiments, the stacked layer structure further comprises a further transparent electrode layer over (and in an example on) the optoelectronic layer. In these embodiments, step calling for replicating the pattern into the optoelectronic layer and the bottom electrode layer comprises replicating the pattern into the further transparent electrode layer, the optoelectronic layer, and the bottom electrode layer, by etching through the further transparent electrode layer, the optoelectronic layer, and the bottom electrode layer selectively with respect to the hard-mask. The further transparent electrode layer protects the layers comprised below the further transparent electrode layer, such as the second charge transport layer, the active optoelectronic layer, or the first charge transport layer.

In embodiments, the further transparent electrode layer is at least transparent to a light at the wavelength of maximum light absorption of an optoelectronic active layer comprised in the optoelectronic layer. In an example, the further transparent electrode layer is transparent to a light at a wavelength of from 200 nm to 2000 nm. Furthermore, the further transparent electrode layer should be electrically conductive. In embodiments, the further transparent electrode layer comprises indium tin oxide.

In example embodiments, the stacked layer structure further comprises a further thin hard-mask layer, i.e., that is not patterned, over the optoelectronic layer, such as on the optoelectronic layer. This further thin hard-mask layer may protect the layer, i.e., material below the further thin hard-mask layer against the ambient and moisture. In embodiments where the stacked layer structure comprises a further transparent electrode layer, the further thin hard-mask layer is in embodiments over, such as on, the further transparent electrode layer. The patterned hard-mask is in embodiments over, such as on, the further thin hard-mask layer. In embodiments where the stacked layer structure comprises the further thin hard-mask layer, step calling for replicating the pattern into the optoelectronic layer and the bottom electrode layer comprises replicating the pattern into the further thin hard-mask layer, the optoelectronic layer, and the bottom electrode layer, by etching through the further transparent electrode layer, the optoelectronic layer, and the bottom electrode layer, and in embodiments wherein the transparent electrode layer is present also the transparent electrode layer, selectively with respect to the hard-mask of the patterned hard-mask. As the further thin hard-mask layer is thin, it is etched away relatively fast. In these embodiments, the etching of the step calling for replicating the pattern into the optoelectronic layer and the bottom electrode layer comprises etching where also the hard-mask material, i.e., of the patterned hard-mask islands or the further thin hard-mask layer, is etched. However, in these embodiments, the etch rate for the other materials comprised in the stacked layer structure is higher than the etch rate for the hard-mask material. The pattern is, in an example, replicated into the optoelectronic layer and the bottom electrode layer, and in embodiments where the transparent electrode layer is present also the transparent electrode layer before the hard-mask island is etched away completely. The further thin hard-mask layer in embodiments comprises the same material as the hard-mask islands. In embodiments, the hard-mask layer and further thin hard-mask layer have been deposited at the same time, after which the hard-mask layer is patterned.

In embodiments, the thickness of the patterned hard-mask, and in embodiments, in addition, the further thin hard-mask layer, may be such that some hard-mask, i.e., from the patterned hard-mask and possibly from the further thin hard-mask layer, remains over the optoelectronic layer after the step calling for replicating the pattern into the optoelectronic layer and the bottom electrode layer. The thickness of the remaining hard-mask may be 50-100 nm. The remaining hard-mask protects the underlying optoelectronic stack and acts as a buffer, i.e., for the etch of step (ii). In some embodiments, the hard-mask may be a dual-layer hard-mask comprising a top layer and a bottom layer, wherein the top layer in the hard-mask is removed in the step calling for replicating the pattern into the optoelectronic layer and the bottom electrode layer and the bottom layer is the hard-mask that remains over the optoelectronic layer after this step. In embodiments, the top layer and bottom layer of the dual-layer hard-mask comprise the same material, and in other embodiments, the top layer and bottom layer of the dual-layer hard-mask comprise a different material.

The first intermediate pixelated stack comprises at least two, i.e., a plurality of, islands of stack that are, at the end of the step calling for replicating the pattern into the optoelectronic layer and the bottom electrode layer, separated from one another by stack-free areas. In embodiments, the lateral dimensions of the islands of stack are at least 100 nm, such as from 100 nm to 10 µm. Each island of stack comprises the bottom electrode layer and the optoelectronic layer. In embodiments, the island of stack comprises the further transparent electrode layer. In embodiments, the top of the islands of stack comprises the hard-mask layer, or at least the part of the hard-mask layer that was not etched away during the etching of the step calling for replicating the pattern into the optoelectronic layer and the bottom electrode layer wherein the hard-mask layer that was not etched away may in embodiments have a thickness of from 20 nm to 200 nm. The islands of stack can form a one-dimensional array or, alternatively, a two-dimensional array.

The electrically insulating layer formed in the step calling for providing the electrically insulating layer on the stack-free areas and covering the at least two islands of stack protects the material of the islands of stack against moisture and oxidation by the ambient atmosphere. Therefore, in an example, the step calling for providing the electrically insulating layer is performed substantially immediately after the etching step calling for replicating the pattern into the optoelectronic layer and the bottom electrode layer. Moreover, by covering the stack-free area with the electrically insulating layer, adjacent islands of stack are electrically insulated from each other, thereby preventing the movement of charges between adjacent islands. The electrically insulating layer may comprise a dielectric material, such as silicon oxide or silicon nitride. In embodiments, the dielectric material may have a dielectric constant lower than silicon oxide.

In embodiments, the step calling for providing the electrically insulating layer/forming the electrically insulating layer on the first intermediate pixelated stack comprises forming a first conformal electrically insulating layer over the first intermediate pixelated stack and providing a second electrically insulating layer on the first dielectric layer to fill the stack-free areas and cover the at least two islands of stack. The first conformal electrically insulating layer may be deposited substantially immediately after the etch of the step calling for replicating the pattern into the optoelectronic layer and the bottom electrode layer in the same setup, i.e., an initial setup. The second electrically insulating layer may be deposited in a separate setup. The first conformal electrically insulating layer, in that case, protects the materials of the islands of stack from ambient air such as moisture, for instance, when transporting the first intermediate pixelated stack, i.e., on top of the substrate, from the initial to the separate setup.

In embodiments, the first conformal electrically insulating layer comprises a dielectric material, such as silicon oxide or silicon nitride. In embodiments, the dielectric material may have a dielectric constant lower than silicon oxide. In embodiments, the second electrically insulating layer comprises a dielectric material, such as silicon oxide or silicon nitride. In embodiments, the dielectric material may have a dielectric constant lower than silicon oxide. In example embodiments, the first conformal electrically insulating layer comprises SiN, and the second electrically insulating layer comprises a dielectric selected from silicon nitride and silicon oxide. In embodiments, the second electrically insulating layer furthermore comprises a metal such as copper and/or cobalt. Copper and/or cobalt can easily be deposited in the stack-free areas.

Removing the top portion of the electronically insulating layer and removing any remaining hard-mask in the step calling for removing the top portion of the electrically insulating layer is typically performed by a chemical mechanical planarization process.

The second intermediate pixelated stack comprises the first intermediate pixelated stack, i.e., at least two islands of stack, wherein the islands of stack are separated from each other by the electrically insulating layer, and wherein the top surfaces of the islands of stack are coplanar with the top surface of the electrically insulating layer. In embodiments, the electrically insulating layer comprises the first conformal electrically insulating layer and the second electrically insulating layer.

The top transparent electrode layer provided in the step calling for forming the top transparent electrode layer should be at least transparent to a light at the wavelength of maximum light absorption of an optoelectronic active layer comprised in the optoelectronic layer and should be electrically conductive. The top transparent electrode layer conducts charges of the second polarity. In embodiments where the stacked layer comprises the further transparent electrode layer, the top transparent electrode may comprise the same material as the further transparent electrode layer. In embodiments, the top transparent electrode layer comprises indium tin oxide. The top transparent electrode layer is a common electrode layer connecting electrically each island of stack.

In embodiments, after the step calling for forming the top transparent electrode layer, the method further comprises forming a transparent capping layer over the top transparent electrode layer. In embodiments, the transparent capping layer electronically and/or physically isolates the top transparent electrode layer from external materials. Moreover, in embodiments, the transparent capping layer prevents potential absorption of moisture or oxidation of the top transparent electrode layer. In an example, the transparent capping layer is at least transparent to a light at the wavelength of maximum light absorption of an optoelectronic active layer comprised in the optoelectronic layer. In an example, the transparent capping layer is transparent to a light at a wavelength of from 200 nm to 2000 nm. The transparent capping layer may be formed, for instance, by physical vapor deposition, atomic layer deposition, evaporation and spin coating. The transparent capping layer may comprise one of the following materials: indium tin oxide, silicon oxide, silicon nitride and transparent organic materials. In an example, the transparent capping layer has a thickness between 50 nm to 500 nm.

In embodiments, the substrate comprises a connection layer on top of an integrated circuit layer, the connection layer comprising conductive elements isolated from one another by a dielectric and connecting the integrated circuit layer to the bottom electrode layer. In embodiments, the conductive elements may be metal pillars. In embodiments, each island of stack is connected via the conductive element to the integrated circuit layer.

For example, the integrated circuit layer can be an active CMOS device, such as a CMOS read-out integrated circuit (ROIC) in the case where the optoelectronic stack is a photodiode stack. The CMOS ROIC is adapted to read out the photocurrent generated in each pixel in an array in a photodiode device formed by the method of the first aspect, wherein a pixel comprises an island of stack. As the movement of charges of the first polarity is prohibited between adjacent pixels, the charge that is read out by the integrated circuit layer for a pixel has been generated in the pixel. In embodiments wherein the charge of the first polarity is the negative charge, the CMOS ROIC reads negative charges. In embodiments wherein the charge of the first polarity is the positive charge, the CMOS ROIC reads positive charges.

This read out can, for instance, be done by accumulating the charge of the first polarity generated in each pixel over a time interval, and then afterward detecting how much charge of the first polarity has been accumulated over the duration of the time interval for each pixel. Dividing the detected accumulated charge by the length of the time interval yields a measure for the average light intensity incident on each pixel over the duration of the time interval.

As another example, the integrated circuit layer can be a CMOS driver integrated circuit in the case where the optoelectronic stack is a light-emitting diode stack. The CMOS driver integrated circuit is adapted to drive current independently to each pixel in an array in a light-emitting device formed by the method of the first aspect, wherein a pixel comprises an island of stack. The light intensity generated in a pixel is dependent on the driving current through that pixel.

In embodiments, between the step calling form removing of the top portion of the electrically insulating layer and the step calling for forming the top transparent electrode layer over the second intermediate pixelated stack, the method may further comprise exposing a conductive element of the connection layer. Exposing the conductive elements may be performed by an etch, for instance, a dry etch, for instance through a patterned photoresist, wherein the patterned photoresist is formed over or on top of the second intermediate pixelated stack and comprises a pattern to expose the conductive element. The etch may be performed by etching through all layers comprised in the second intermediate pixelated stack, selectively with respect to the photoresist, thereby replicating the pattern of the patterned photoresist into the second intermediate pixelated stack. Thereby, the second intermediate pixelated stack comprises the pattern for exposing the conductive element. In an example, etching through all layers comprised in the second intermediate pixelated stack comprises etching through the electrically insulating layer, i.e., between the islands of stack. The etch, in an example, has a lower etch rate towards the conductive elements, and towards the dielectric of the connection layer surrounding the conductive elements, than towards the second intermediate pixelated stack, such as towards the electrically insulating layer. Subsequently, the patterned photoresist is removed.

By exposing the conductive elements, the top transparent electrode layer that is deposited on the second intermediate pixelated stack in the step calling for forming the top transparent electrode layer over the second intermediate pixelated stack may be in electrical contact with the conductive elements and the integrated circuit layer. As such, the charges of the second polarity generated in the device produced by this method are conducted through the top transparent electrode layer and the conductive elements, into the integrated circuit layer, thereby forming a closed electrical circuit.

In embodiments, the connection layer may further comprise a probe pad on the integrated circuit layer and the method may further comprise exposing the probe pad. Exposing the probe pad may be performed by an etch, for instance, a dry etch, for instance, through a patterned photoresist, wherein the patterned photoresist comprises a pattern to expose the probe pad and is formed over or on top of the transparent electrode. In embodiments wherein the method comprises the step calling for forming a transparent capping layer over the top transparent electrode layer, the step calling for exposing of the probe pad is, in embodiments, performed after forming the transparent capping layer, and the patterned photoresist is formed over or on top of the transparent capping layer. The etch may be performed by etching through all layers on top of the substrate, selectively with respect to the photoresist, thereby replicating the pattern of the patterned photoresist into the layers on top of the substrate. Thereby, all layers on top of the substrate comprise the pattern to expose the probe pad. Subsequently, the patterned photoresist is removed.

The probe pad may be used for transmission of power and signal between the pixelated optoelectronic stack on top of the substrate and one or more external devices. For example, if the optoelectronic stack is a photodiode stack, e.g., the signal, i.e., photocurrent collected by the pixels of the pixelated optoelectronic stack may be transmitted to the external device via the probe pad. In another example, if the optoelectronic stack is a light-emitting diode stack, power may be transmitted from the external device to the pixels of the pixelated optoelectronic stack via the probe pad, so that the pixels may emit light.

In example embodiments, each island of stack has lateral dimensions of from 10 µm to 100 µm. The lateral dimensions are, however, not limited to that and may be smaller or larger. In embodiments, each island of stack corresponds to a pixel of the pixelated optoelectronic stack. Therefore, the pixel size of an optoelectronic device comprising the pixelated optoelectronic stack in embodiments has the same size as the islands of stack.

In embodiments, the distance between two adjacent islands of stack is from 50 nm to 5 µm. The distance is, however, not limited to that and may be smaller or larger.

In embodiments, the optoelectronic layer comprises an organic semiconducting material. In an example, the active optoelectronic layer comprises or consists of organic materials or comprises quantum dots.

In embodiments, the pixelated optoelectronic stack comprises the second intermediate pixelated stack on top of the substrate and the top transparent electrode layer over or on top of the second intermediate pixelated stack. In embodiments, the pixelated optoelectronic stack further comprises the transparent capping layer over or on top of the transparent electrode material. In some embodiments where the substrate comprises the conductive element and the integrated circuit layer, the second intermediate pixelated stack may comprise the pattern to expose the conductive element and the top transparent electrode layer of the pixelated optoelectronic stack may be in electrical contact with the conductive elements and the integrated circuit layer. In embodiments wherein the connection layer of the pixelated optoelectronic stack comprises the probe pad, all layers on top of the substrate may comprise the pattern to expose the probe pad.

A second aspect relates to an intermediate structure in the formation of a pixelated optoelectronic device. The device comprises a stacked layer structure on a substrate. The stacked layer structure comprises a continuous bottom electrode layer, an optoelectronic layer over the bottom electrode layer, and a patterned hard-mask over the optoelectronic layer and comprising a pattern comprising at least two hard-mask islands separated by a hard-mask-free area. The vertical projection of each hard-mask island on a top surface of the continuous bottom electrode layer is comprised therein.

Any feature of the second aspect may be as correspondingly described in the first aspect.

Several example embodiments are described below to further elucidate the aspects described above. It is clear that other embodiments can be configured according to the knowledge of persons skilled in the art without departing from the technical teachings herein or as defined by the claims. In some example embodiments, the stacked layer may comprise a further thin hard-mask layer between the optoelectronic layer and the patterned hard-mask layer.

FIG. 1 to FIG. 9 show schematic representations of vertical cross-sections through intermediate structures obtained after different steps of the method according to the first aspect for forming a pixelated optoelectronic stack on top of a substrate.

Referring to FIG. 1, the substrate 1 comprises integrated circuit layer 11 and a connection layer 12 on top of the integrated circuit layer 11. The connection layer 12 comprises conductive elements 121 isolated from each other by a dielectric 122. In addition, in this embodiment, the connection layer 12 comprises a probe pad 123.

Figure 2:
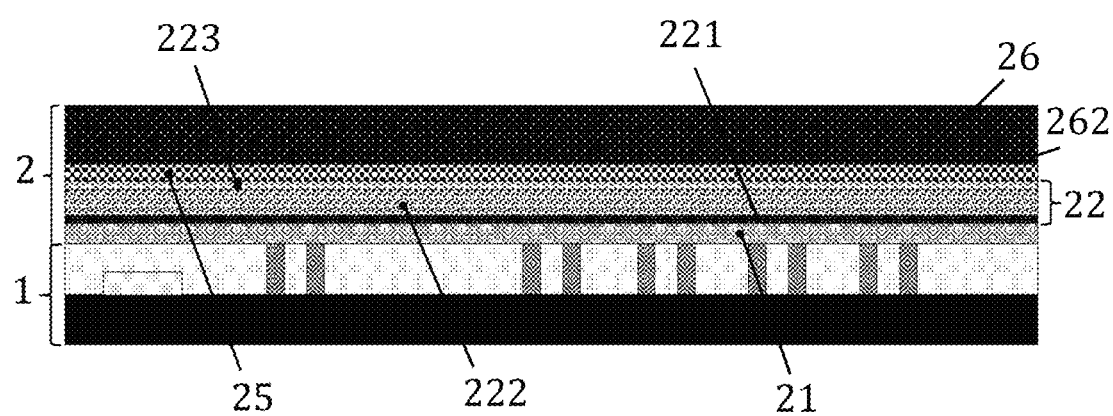

Referring to FIG. 2, a stacked layer 2 is deposited on the substrate 1. The stacked layer 2 comprises a bottom electrode layer 21, an optoelectronic layer 22 over the bottom electrode layer 21, a further transparent electrode layer 25 over the optoelectronic layer 22, a further thin hard-mask layer 262 over the further transparent electrode layer 25, and a hard-mask layer 26 over the further thin hard-mask layer 262. The hard-mask layer 26 and the further thin hard-mask layer 262 may comprise the same material and be formed in the same step. The optoelectronic layer 22 comprises a first charge transport layer 221, an active optoelectronic layer 222 and a second charge transport layer 223. The bottom electrode layer 21 is not patterned, so that the top surface of the bottom electrode layer 21, i.e., the first charge transport layer 221 is smooth and defect-free. As a result, there is good contact between the bottom electrode layer 21 and the optoelectronic layer 22.

Figure 3:
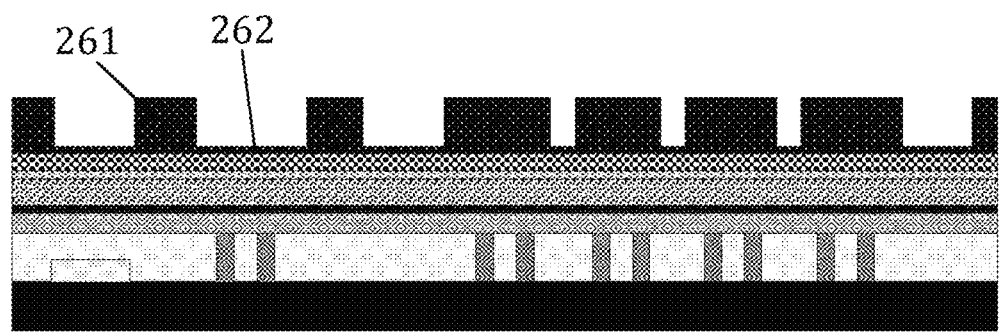

Referring to FIG. 3, the hard-mask layer is patterned, for instance, using deep-UV lithography, yielding the patterned hard-mask 261 on top of the further thin hard-mask layer 262.

Figure 4:
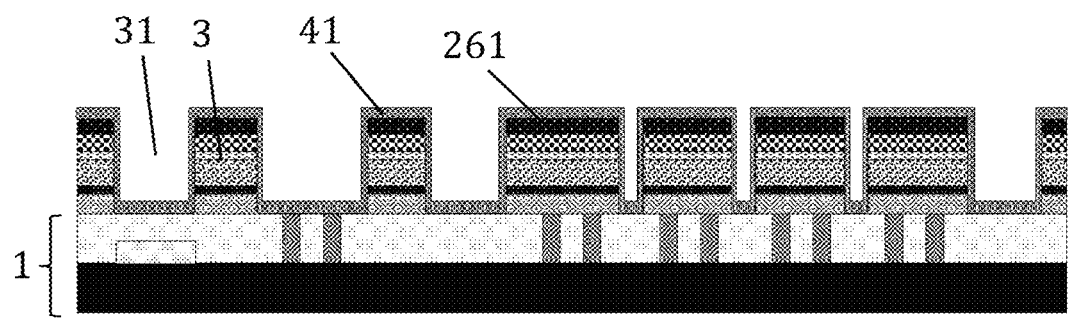

Referring to FIG. 4, the pattern of the hard-mask layer is replicated into the layers on top of the substrate 1 by etching through all layers on top of the substrate 1 selectively with respect to the hard-mask. The etch is selective with respect to the hard-mask, which in this embodiment means that the etch rate towards the hard-mask is considerably slower than the etch rate towards the other layers on top of the substrate. The patterned hard-mask 261 was thick enough so that some of the patterned hard-mask 261 has remained after this step. The etching yields a first intermediate pixelated stack on top of the substrate 1, the first intermediate pixelated stack comprising at least two islands of stack 3 separated from one another by stack-free areas 31. Immediately after the etching step, a first conformal electrically insulating layer 41 is deposited on top of the first intermediate pixelated stack, thereby, for instance, protecting the islands of stack 3 from moisture or ambient air.

Figure 5:
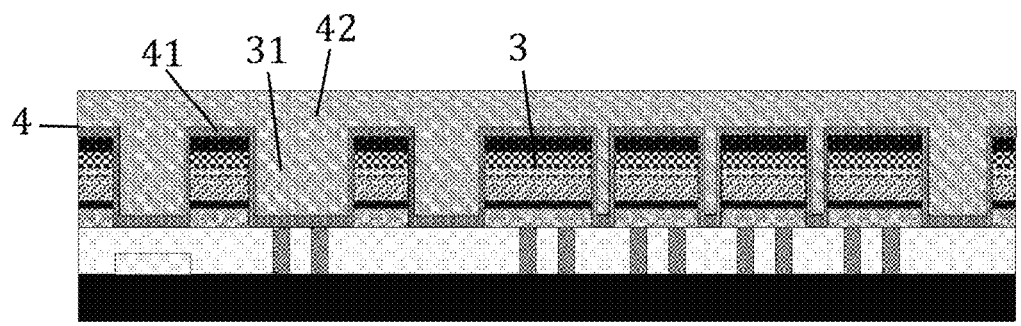

Referring to FIG. 5, a second electrically insulating layer 42 is formed over the first conformal electrically insulating layer 41. As a result, an electrically insulating layer 4, i.e., comprising the first conformal electrically insulating layer 41 and the second electrically insulating layer 42 fills the stack-free areas 31 and covers the islands of stack 3.

Figure 6:
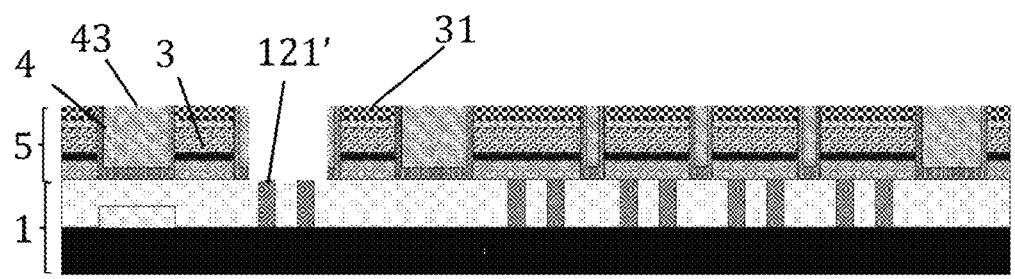

Referring to FIG. 6, the top portion of the electrically insulating layer 4 and any remaining hard-mask are removed, so that a top surface of the electrically insulating layer 43 is coplanar with an exposed top surface of the first intermediate pixelated stack 31. This yields a second intermediate pixelated stack 5 on top of the substrate 1. Next, a pair of conductive elements 121' comprised on the substrate 1 are exposed, for instance, by etching through the layers on top of the substrate 1 selectively with respect to a patterned photoresist (not shown), i.e., comprising a pattern, deposited on top of the second intermediate pixelated stack 5. Thereby, the second intermediate pixelated stack 5 comprises the pattern of the patterned photoresist.

Figure 7:
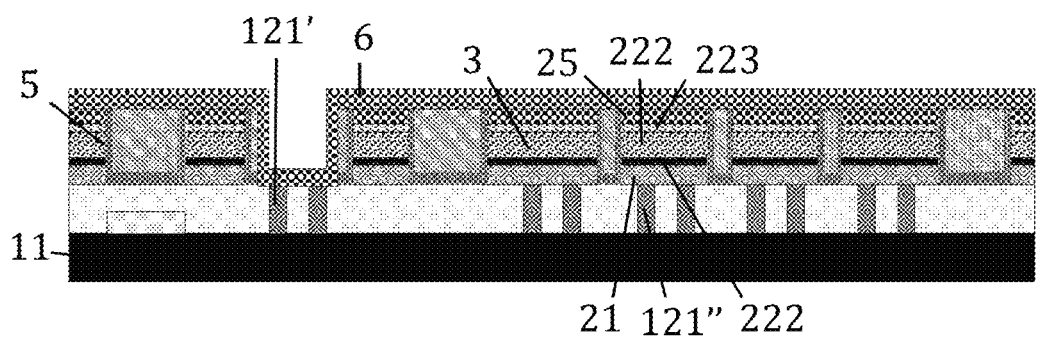

Referring to FIG. 7, a top transparent electrode layer 6 is formed over the second intermediate pixelated stack. The top transparent electrode layer 6 is thereby in electrical contact with the islands of stack 3. As the conductive elements 121' were exposed, they are also electrically contacted by the top transparent electrode layer 6. Therefore, charges of a second polarity can flow between the second charge transport layer 223, i.e., on top of and in electrical contact with the active optoelectronic layer 222, and the integrated circuit layer 11, i.e., via the further transparent electrode layer 25 and via the top transparent electrode layer 6, and via the conductive elements 121' in contact with the top transparent electrode layer 6. Charges of a first polarity can flow between the first charge transport layer 221, i.e., underneath and in electrical contact with the active optoelectronic layer 222, and the integrated circuit layer 11, i.e., via the bottom electrode layer 21 and the conductive elements 121" in contact with the bottom electrode layer 21.

Figure 8:
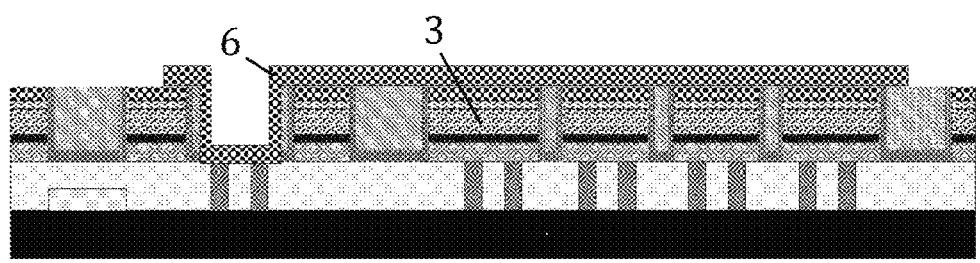

Referring to FIG. 8, part of the top transparent electrode layer 6 is removed, thereby limiting the size of the array of islands of stack, i.e., the number of pixels that are in contact with the top transparent electrode layer 6. Another reason for this will be clear from FIG. 9.

Figure 9:
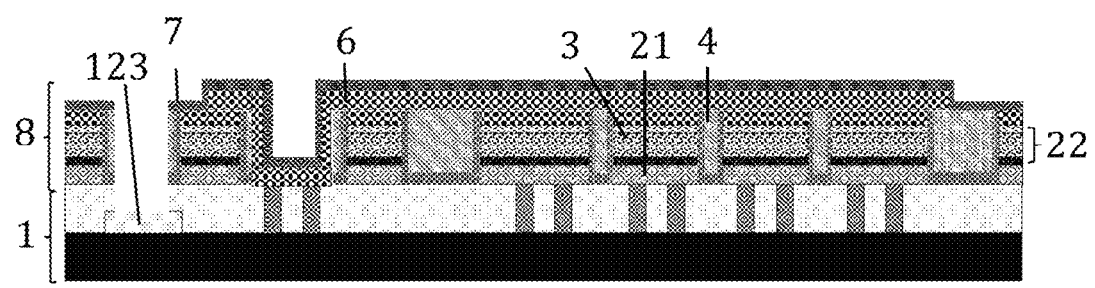

Referring to FIG. 9, a transparent capping layer 7 is deposited over the top transparent electrode layer 6. In this embodiment wherein part of the top transparent electrode layer 6 was removed, the transparent capping layer 7 is also deposited over the area where the top transparent electrode layer 6 was removed. The transparent capping layer 7 prevents electrical contact of the top transparent electrode layer 6, e.g., with external material, or the contact of the transparent electrode layer 6 with the ambient. Next, the probe pad 123 is exposed by etching through the layers on top of the probe pad 123 selectively with respect to a patterned photoresist (not shown), i.e., comprising a pattern deposited on top of the transparent capping layer 7. Thereby, the layers above the probe pad 123 comprise the pattern of the patterned photoresist. As part of the top transparent electrode layer 6 was removed, and thereafter covered by the transparent capping layer 7. For instance, a wire (not shown) can be contacted with the probe pad 123 without electrically contacting the top transparent electrode layer 6. Thus, the pixelated optoelectronic stack 8 on top of the substrate 1 is obtained.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for forming a pixelated optoelectronic stack on a substrate, the method comprising:
    forming a stacked layer structure on a substrate, the stacked layer structure comprising:
        a bottom electrode layer;
        an optoelectronic layer over the bottom electrode layer; and
        a patterned hard-mask over the optoelectronic layer, wherein a pattern of the patterned hard-mask comprises at least two hard-mask islands separated by a hard-mask-free area;
    replicating the pattern into the optoelectronic layer and the bottom electrode layer by etching through the optoelectronic layer and the bottom electrode layer selectively with respect to the hard-mask, thereby forming a first intermediate pixelated stack on top of the substrate, the first intermediate pixelated stack comprising at least two islands of stack separated from one another by stack-free areas;
    forming an electrically insulating layer on the first intermediate pixelated stack to fill the stack-free areas and cover the at least two islands of stack;
    removing a top portion of the electrically insulating layer and removing any remaining hard-mask so that a top surface of the electrically insulating layer is coplanar with an exposed top surface of the first intermediate pixelated stack, yielding a second intermediate pixelated stack on top of the substrate; and
    forming a top transparent electrode layer over the second intermediate pixelated stack.

2. The method according to claim 1, wherein the stacked layer structure further comprises a further transparent electrode layer over the optoelectronic layer and wherein replicating the pattern into the optoelectronic layer and the bottom electrode layer comprises replicating the pattern into the further transparent electrode layer, the optoelectronic layer, and the bottom electrode layer, by etching through the further transparent electrode layer, the optoelectronic layer, and the bottom electrode layer selectively with respect to the hard-mask, thereby forming the first intermediate pixelated stack on top of the substrate, the first intermediate pixelated stack comprising at least two islands of stack separated from one another by stack-free areas.

3. The method according to claim 1, wherein the optoelectronic layer comprises:
    a first charge transport layer for transporting charges of a first polarity on top of the bottom electrode;
    an active optoelectronic layer on top of the first charge transport layer; and
    a second charge transport layer for transporting charges of a second polarity on top of the optoelectronic layer.

4. The method according to claim 3, wherein the stacked layer structure further comprises a further transparent electrode layer over the optoelectronic layer and wherein replicating the pattern into the optoelectronic layer and the bottom electrode layer comprises replicating the pattern into the further transparent electrode layer, the optoelectronic layer, and the bottom electrode layer, by etching through the further transparent electrode layer, the optoelectronic layer, and the bottom electrode layer selectively with respect to the hard-mask, thereby forming the first intermediate pixelated stack on top of the substrate, the first intermediate pixelated stack comprising at least two islands of stack separated from one another by stack-free areas.

5. The method according to claim 4, wherein after forming the top transparent electrode layer over the second intermediate pixelated stack, the method comprises forming a transparent capping layer over the top transparent electrode layer.

6. The method according to claim 5, wherein the optoelectronic layer is a photodiode stack.

7. The method according to claim 6, wherein forming the electrically insulating layer on the first intermediate pixelated stack comprises forming a first conformal electrically insulating layer over the first intermediate pixelated stack and providing a second electrically insulating layer on a first dielectric layer to fill the stack-free areas and cover the at least two islands of stack.

8. The method according to claim 7, wherein the first conformal electrically insulating layer comprises SiN, and wherein the second electrically insulating layer comprises a dielectric selected from silicon nitride and silicon oxide.

9. The method according to claim 1, wherein after forming the top transparent electrode layer over the second intermediate pixelated stack, the method comprises forming a transparent capping layer over the top transparent electrode layer.

10. The method according to claim 1, wherein the optoelectronic layer is a photodiode stack.

11. The method according to claim 1, wherein forming the electrically insulating layer on the first intermediate pixelated stack comprises forming a first conformal electrically insulating layer over the first intermediate pixelated stack and providing a second electrically insulating layer on a first dielectric layer to fill the stack-free areas and cover the at least two islands of stack.

12. The method according to claim 11, wherein the first conformal electrically insulating layer comprises SiN, and wherein the second electrically insulating layer comprises a dielectric selected from silicon nitride and silicon oxide.

13. The method according to claim 1, wherein the substrate comprises a connection layer on top of an integrated circuit layer, the connection layer comprising conductive elements isolated from one another by a dielectric and connecting the integrated circuit layer to the bottom electrode layer.

14. The method according to claim 13, wherein the connection layer further comprises a probe pad on the integrated circuit layer and wherein the method further comprises exposing the probe pad.

15. The method according to claim 13, wherein after removing the top portion of the electrically insulating layer and removing any remaining hard-mask and before forming the top transparent electrode layer over the second intermediate pixelated stack, the method further comprises exposing a conductive element of the connection layer.

16. The method according to claim 15, wherein the connection layer further comprises a probe pad on the integrated circuit layer and wherein the method further comprises exposing the probe pad.

17. The method according to claim 1, wherein each island of stack has lateral dimensions of from 10 μm to 100 μm.

18. The method according to claim 1, wherein a distance between two adjacent islands of stack is from 50 nm to 5 μm.

19. The method according to claim 1, wherein the optoelectronic layer comprises an organic semiconducting material.

20. The method according to claim 1, wherein a thickness of the patterned hard-mask is such that some hard-mask remains over the optoelectronic layer after replicating the pattern into the optoelectronic layer and the bottom electrode layer.

\* \* \* \* \*